April 25, 1961 F. M. POSKOZIM 2,981,838

COMBINED CHANNEL SELECTOR AND FINE TUNER

Filed Aug. 23, 1957

INVENTOR.
Frank M. Poskozim,
BY
Mueller & Aichele
Att'ys.

United States Patent Office 2,981,838
Patented Apr. 25, 1961

2,981,838

COMBINED CHANNEL SELECTOR AND FINE TUNER

Frank M. Poskozim, Chicago, Ill., assignor to Motorola, Inc., Chicago, Ill., a corporation of Illinois Filed Aug. 23, 1957, Ser. No. 679,966

14 Claims. (Cl. 250—40)

This invention relates to new and useful improvements in tuners for television receivers and more particularly to a combined channel selector and fine tuner.

Combined fine tuners and channel selectors for television receivers generally include a rotary channel selector switch having positions corresponding to the various channels that may be received by the set. In the VHF band there are twelve channels or stations which are selected by the channel selector switch. In each position, the switch renders effective certain tuning elements, such as inductors or capacitors, which are adjusted for the reception of signals in that particular channel. Even when care is exercised in adjusting the tuning elements as accurately as possible before the receiver is placed in service, slight errors occur in the settings of these elements.

It is desirable, therefore, that some provision be made for fine tuning each of the channels to compensate for possible errors in the adjustment of the main tuning elements. Furthermore, it is desirable that such provision be available to eliminate an unwanted signal which interferes with the signal being received. It has been suggested that each channel be equipped with individual adjusting means to establish a desired tuning for the channel. However, such a tuning arrangement has never been satisfactory because of the disadvantages of providing a large number of control knobs for tuning each channel. Another method of tuning individual channels has involved the use of a trimmer condenser which is operated by a fine tuning knob mounted coaxially with the channel selector knob. In such an arrangement it is possible to tune individual channels as they are set. However, the fine tuning which is accomplished for an individual channel is applicable only to that channel and upon turning the channel selector switch to a new channel, it may be necessary to adjust the fine tuning knob to vary the setting of the trimmer condenser to the desired setting for the new channel.

It is, accordingly, one object of this invention to provide a new and improved combined channel selector switch and fine tuner.

Another object is to provide an improved rotary channel selector switch and associated fine tuner to provide fine tuning for individual channels which is not affected upon changing from one channel to another.

A feature of this invention is the provision of an improved television channel selector and fine tuner which includes individual tuning means for each channel and adjustment means movable by the channel selecting means into alignment with the tuning means for the channel selected and operable by a fine tuner knob.

Another feature is the provision of an improved channel selector and fine tuner having separate adjustable oscillator coils for each channel and having an adjusting member moved by the channel selector into alignment with the oscillator coil for the channel selected and operable by a fine tuning knob to adjust the oscillator coil for finely tuning the channel slected.

In the accompanying drawings there is shown a preferred embodiment of this invention, in which.

Figures 1, 2, 3, 4:
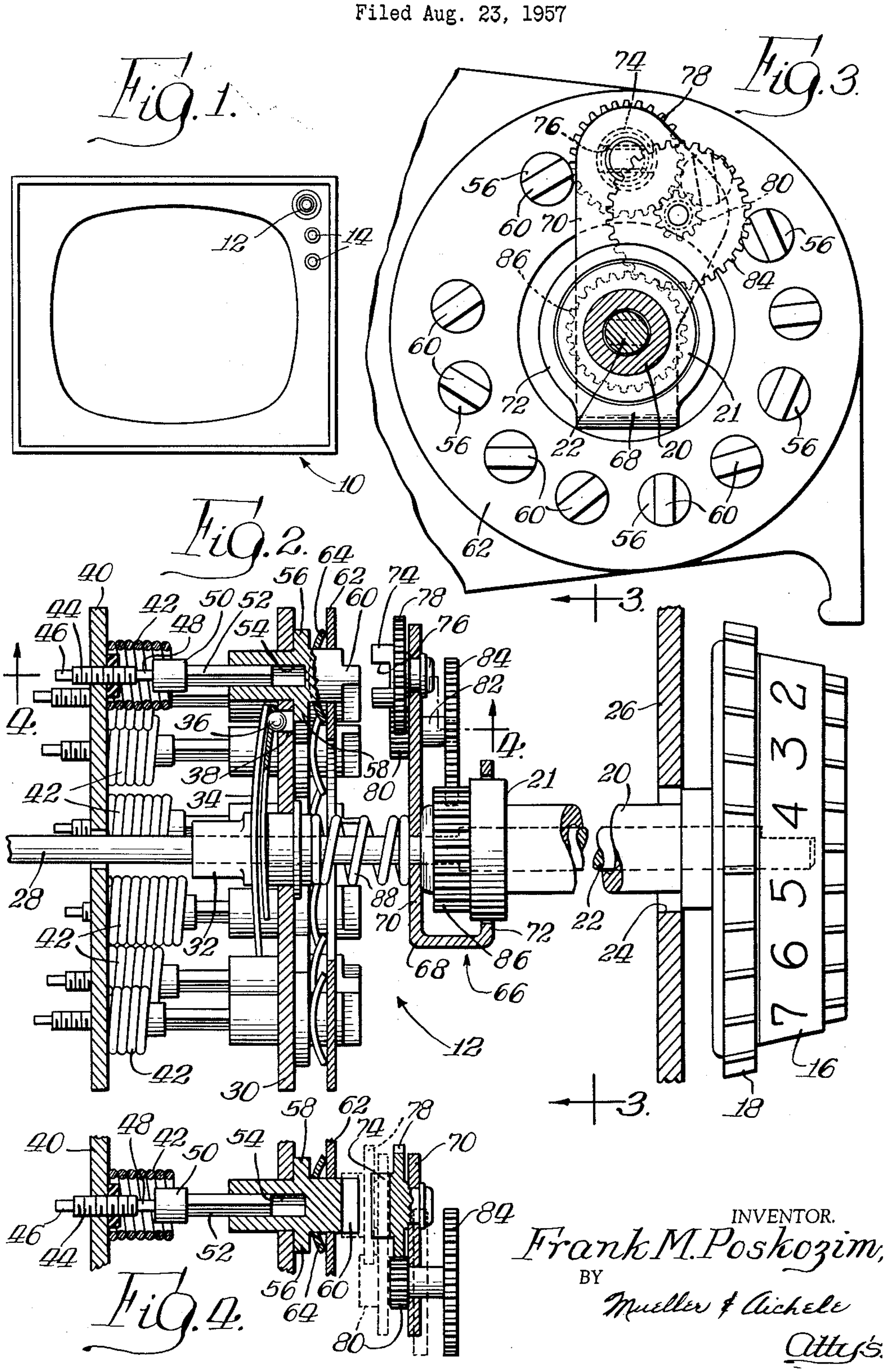
Fig. 1 is a view in front elevation of a television receiver having the combined channel selector and fine tuner of the invention.
Fig. 2 is a view in longitudinal section of the tuner showing the relationship of the channel selector and the fine tuner to the individually adjustable oscillator coils.
Fig. 3 is a view taken on the section 3—3 of Fig. 2 showing the relationship of the fine tuning adjustment member to the individually adjustable oscillator coils.
Fig. 4 is a sectional view taken on the line 4—4 of Fig. 2 showing the fine tuning selector mechanism in engagement with the adjustment member for the individually adjustable oscillator coil.

This invention consists of a new and improved combined channel selector and fine tuner for a television set. In this apparatus there is provided an arrangement in which an adjustment member is rotated with the channel selector and is movable axially and actuated by a fine tuning knob to adjust individual oscillator coils for finely tuning individual channels.

Referring to the drawings by numerals of reference and more particularly to Fig. 1, there is shown a television receiver 10 having a tuner 12 which is a combined channel selector and a fine tuner, and a plurality of adjustment knobs 14 for making other required adjustments to the received signal. As is shown in Fig. 2, the tuner 12 includes a channel selector knob 16 and a fine tuning knob 18 which are secured on the outer end of a pair of coaxially mounted shafts 20 and 22. The shafts 20 and 22 extend through an aperture 24 in the wall 26 of the television cabinet. The inner shaft 22 which operates the channel selector has a flat portion 28 which extends through the tuner and is connected to a channel selector switch of known design which is not shown herein.

The fine tuning portion of the apparatus includes a tuner supporting plate 30 having a guide sleeve 32 mounted thereon through which the flattened portion 28 of the channel selector shaft 22 extends. The sleeve member 32 is mounted on the channel selector shaft 22 for rotation therewith. On the sleeve portion 32 there is supported a spring 34 which cooperates with a metal ball 36 which is movable from one to another of a plurality of holes 38 in the supporting plate 30 and provides a detent mechanism for fixing the individual channel positions of the channel selector knob 16.

There is also provided a supporting plate 40 on which there are positioned a plurality of oscillator coils 42 for the individual channels selected by the channel selector. The individual oscillator coils 42 each have a movable core 44 therein which is threadedly adjustable in supporting plate 40. The cores 44 each have end portions 46 and 48 which are of reduced size and unthreaded and thus limit the movement of the oscillator cores. The oscillator cores 44 each have a connector portion 50 having an end portion 52 of square or other non-circular cross-section which fits into a recess 54 in a rotary adjustment member 56. The rotary adjustment member 56 extends through an aperture in the supporting plate 30 and has a flange or shoulder 58 which rides on the supporting wall 30. The adjusting members 56 each have an outwardly extending projection or actuating surface 60 which is adapted to be actuated by an actuating structure yet to be described. The rotary adjustment members 56 extend into apertures in an annularly shaped retaining plate 62 which rests against a spring washer 64 on each of the actuating members 56.

The fine tuner arrangement includes an actuating or adjusting structure 66 which includes a U-shaped bracket member 68 having one leg portion 70 fitted over and engaging the flattened portion 28 of channel selector shaft 22 for rotation therewith and another leg portion 72 fitting over an enlarged portion 21 of the fine tuner shaft 20 while permitting rotation of the fine tuner shaft. The bracket 68 has an adjustment member 74 rotatably carried on the outer end of the leg 70 and having a slot 76 which is adapted to be engaged with the actuating projection 60 of the actuating members 56. The slotted adjustment member 74 has a gear 78 secured thereto for rotary adjustment thereof which meshes with another gear 80 which is rotatably supported on leg 70. Gear 80 is connected by a shaft 82 to another gear 84 which meshes with a gear 86 which is secured to shaft 20 for rotation therewith. The fine tuner mechanism includes a spring 88 which abuts the end of the sleeve portion 32 on the supporting plate 30 and also abuts the leg 70 of the bracket 68 and urges the shaft 20 and tuning knob 18 to the right as viewed in Fig. 2.

In operation, the channel selector and fine tuner knobs 16 and 18 normally are in the position shown in Fig. 2 and may be rotated to provide the desired adjustment. The channel selector knob 16 is rotatable to rotate shaft 22 independently of the rotation of the fine tuner knob 18 and its shaft 20. The rotation of the channel selector knob 16 and shaft 22 rotates a channel selector switch, which is not shown, to connect in the television circuit the individual oscillator coils 42 for the channel selected and to also connect other elements. When the channel selector knob 16 is rotated to a desired channel the bracket 68 is rotated therewith and the adjustment member 78 is aligned with one of the rotary adjustment members 56 as shown in Figs. 2 and 4.

The knob 18 is then pushed inward (to the left as viewed in Fig. 2), thus compressing the spring 88 and moving the shaft 20 to the left. This movement brings the adjustment member 74 into engagement with the projecting portion 60 of the actuating member 56 as shown in the dotted line position in Fig. 4. In this position rotation of the fine tuner knob 18 will cause shaft 20 to rotate and thus rotate gears 86, 84, 80, and 78 to cause the adjustment member 74 to rotate. This rotation of adjustment member 74 will cause member 56 to rotate and turn the threaded core member 44 of oscillator coil 42. This rotation of the threaded core 44 will cause it to move longitudinally within the oscillator coil 42 and will provide a fine tuning adjustment for the individual channel controlled by the coil 42.

By rotation of the channel selector knob 16 to each of the various channels which are received by the television receiver, it is possible to make this fine tuning adjustment for each of the oscillator coils 42. This adjustment is a substantially permanent one for each of the channels received and is independent of the switching of the channel selector knob from one channel to another. A fine tuning adjustment made in this manner would, in normal operation, be satisfactory for several months of operation of the television receiver until further aging of the electronic components might necessitate further adjustment.

It is readily apparent that this combined fine tuner and channel selector provides a means for selecting individual channels for viewing on the television receiver and for fine tuning the reception on each channel to provide a substantially permanent fine tuning adjustment. This arrangement has the important advantage that it provides an adjustment which may be performed by the owner of the set without necessitating the services of a television technician or service man.

I claim:

1. A television tuner of the channel selector type including in combination, a fine tuning knob, a channel selector knob, a pair of coaxial shafts supporting said knobs for independent rotation, one of said shafts being adapted to be connected to channel selector means, a plurality of independently adjustable fine tuning control means one for each channel, a rotary actuator member supported on said one shaft and movable thereby into alignment with said tuning control means corresponding to the channel selected by said channel selector knob, and driving means coupled to said actuator member and to the other of said shafts and operable by said fine tuning knob for rotating said actuator member to adjust the fine tuning control means aligned therewith without impairing the adjustment of the other fine tuning control means.

2. A television tuner including in combination, a pair of supporting members disposed in spaced parallel relation, first and second individually rotatable shafts supported in coaxial relation by said supporting members with said first shaft being axially movable, a plurality of independently adjustable tuning means one for each channel, a rotatable adjusting member engageable with each of said tuning means for adjusting the same, support means rotatable by said second shaft for aligning said adjusting member with each of said tuning means successively, and driving means coupled to said first shaft and operatively connected to said adjusting member for rotating the same, said first shaft being movable axially for engaging said adjusting member with one of said tuning means and being rotatable to operate said driving means for adjusting said engaged tuning means.

3. A television tuner including in combination, a fine tuning knob, a channel selector knob, a pair of coaxial shafts supporting said knobs for independent rotation, means supporting said shafts, one of said shafts being adapted to be connected to a channel selector switch, a plurality of independently adjustable tuning means one for each channel of the channel selector switch, an actuating member supported on said one shaft and movable thereby into a position spaced from and aligned with the fine tuning means corresponding to the channel selected by said channel selector knob, the other of said shafts being axially movable, and gear means operatively connected to said other shaft for actuation by said fine tuning knob, said gear means being connected to said actuating member to move the same, said fine tuning knob being movable axially to move said other shaft axially whereby said actuating member engages said fine tuning means with which it is aligned, and being rotatable to adjust the aligned fine tuning means to a desired setting.

4. A television tuner including in combination, a tuning knob, a channel selector knob, first and second coaxial shafts supporting said knobs for independent rotation, means supporting said shafts with said first being axially movable, spring means urging said first shaft axially to a fixed initial position, said second shaft being adapted to be connected to a channel selector switch, a plurality of separate rotary tuning members with one for each channel of said channel selector switch, an actuating member supported on said second shaft and rotatable thereby into a position spaced from and aligned with the rotary tuning member corresponding to the channel selected by said channel selector, gear means supported on said first shaft and interconnecting said first shaft and said actuating member to transmit movement therebetween, said fine tuning knob being operable to be depressed to move said first shaft axially against the force of said spring means to engage said actuating member with one of said rotary tuning members and operable to adjust the rotary tuning member to a desired setting.

5. A television tuner and channel selector including in combination, a fine tuning knob, a channel selector knob, a pair of coaxial shafts supporting said knobs for independent rotation, means supporting said shafts, one of said shafts being adapted to be connected to a channel selector switch, a plurality of separate oscillator coils with one for each channel of said channel selector, an independently adjustable core for each coil, a rotary actuating member supported on said one shaft and movable thereby into a position spaced from and aligned with the oscillator coil corresponding to the channel selected by said channel selector, the other of said shafts being axially movable, driving means operatively connected to said other shaft for actuation by said fine tuning knob and operatively connected to said actuating member to rotate the same, said tuning knob being operable to be depressed to move said other shaft axially to engage said actuating member with one of said adjustable cores and upon rotation of said fine tuning knob to adjust said core to fine tune the corresponding coil to a desired setting.

6. A television tuner including in combination, a fine tuning knob, a channel selector knob, first and second coaxial shafts supporting said knobs for independent rotation, means supporting said shafts, said first shaft being axially movable, spring means urging said first shaft axially to a fixed initial position, said second shaft being adapted to be connected to a channel selector switch, a plurality of separate oscillator coils with one for each channel of the channel selector, a threaded adjustable core for each coil, an actuating member supported on said second shaft and movable thereby into a position spaced from and aligned with the adjustable core of the oscillator coil corresponding to the channel selected by said channel selector, gear means supported on said shafts and interconnecting said first shaft and said actuating member to transmit movement therebetween, said fine tuning knob being operable to be depressed to move said first shaft axially against the force of said spring means to engage said actuating member with one of said threaded cores and being rotatable to adjust the same to fine tune the corresponding oscillator coil to a desired setting.

7. A television fine tuner including in combination, a fine tuning knob, a channel selector knob, inner and outer coaxial shafts supporting said knobs for independent rotation, means supporting said shafts with said outer shaft being axially movable, spring means urging said outer shaft axially to a fixed initial position, said inner shaft being adapted to be connected to a channel selector switch, a plurality of separate oscillator coils one for each channel of said channel selector switch, a threaded adjustable core for each of said coils, a bracket member supported on said inner shaft for rotation therewith, a rotary actuating member supported on the outer end of said bracket member and movable to a positoin adjacent the core for the coil corresponding to the channel selected, first gear means connected to said actuating member for rotating the same, second gear means mounted on said outer shaft for rotation therewith, third gear means supported on said bracket member and interconnecting said second gear means and said first gear means to transmit rotary movement between said outer shaft and said actuating member, and said fine tuning knob being operable to be depressed to move said outer shaft axially against the force of said spring means and to engage said actuating member with one of said cores and operable upon rotation of said fine tuning knob to fine tune the core in the oscillator coil to a desired setting.

8. A fine tuning device for a television tuner of the channel selector type having a rotatable selector shaft, said device including in combination, a fine tuning shaft rotatably supported in substantially parallel relation with the selector shaft, a plurality of independently adjustable fine tuning control means one for each channel of the tuner and arrayed circularly about the selector shaft, a rotatable adjusting member positioned adajcent the circular array of said tuning control means, a support member on the selector shaft and rotatable thereby to align said adjusting member with each of said tuning control means in succession as the corresponding channel is selected, and driving means coupling said fine tuning shaft with said adjusting member, said fine tuning shaft being movable to cause said adjusting member to engage the aligned tuning control means, said driving means being operable by rotating said fine tuning shaft to rotate said adjusting member and thereby adjust the fine tuning control means aligned therewith independently of the other fine tuning control means.

9. A fine tuning device for a televisian tuner of the channel selector type having a rotatable selector shaft, said device including in combination, a fine tuning shaft, means supporting said fine tuning shaft for rotary movement and for axial movement, spring means urging said fine tuning shaft axially to a fixed initial position, a plurality of independently adjustable rotary tuning control members one for each channel of the tuner and disposed circularly about the selector shaft, a rotatable actuating member positioned adjacent the circular array of said tuning control means, a support member on the selector shaft and rotatable thereby to align said actuating member and any one of said tuning control members, gear means interconnecting said fine tuning shaft and said actuating member for transmitting rotary movement therebetween, and a fine tuning knob on said fine tuning shaft being operable to be depressed to move said fine tuning shaft axially against the force of said spring means for engaging said actuating member with the tuning control member aligned therewith and being rotatable to adjust the engaged tuning control member to a desired setting.

10. In a television receiver adapted to receive television signals in a plurality of channels each of different predetermined frequency in the very high frequency range, tuning apparatus for providing channel selection and fine tuning of the selected channels, including in combination, rotary channel selector means including a channel selector shaft having a plurality of angularly spaced positions corresponding respectively to channels of the television receiver for selecting such channels, first, second and third supporting structures spaced along said channel selector shaft and each extending transversely of said channel selector shaft, said channel selector shaft extending through and being rotatable with respect to said first supporting structure, coil means controlling the fine tuning of the channels selected by said channel selector means and supported by said first supporting structure in a fixed position, core means having a portion positioned within said coil means and movable axially of said coil means for adjusting the fine tuning of the channels selected by said channel selector means, a plurality of rotary fine tuning control members corresponding respectively to the channels selected by said channel selector means, said fine tuning control members being rotatably mounted on said second supporting structure in a circular array for independent adjustment, means coupling individual ones of said fine tuning control members to said core means for axially adjusting said core means, a rotary adjusting device supported by said third supporting structure in a position adjacent the circular array of said fine tuning control members and engageable with individual ones thereof for adjusting the same, means coupling said channel selector shaft to one of said second and third supporting structures for rotating the same to align said rotary adjusting device and any selected tuning control member corresponding to a channel selected by said channel selector means, a fine tuning shaft extending in the same direction as said channel selector shaft and connected to said third supporting structure, said fine tuning shaft being movable axially to move said third supporting structure and said adjusting device toward said second supporting structure for engaging said adjusting device with said selected fine tuning control member, spring means urging said fine tuning shaft, said third supporting structure and said adjusting device to an initial position in which said adjusting device is disengaged from said selected fine tuning control member, and gear means coupling said fine tuning shaft to said adjusting device for rotating said device upon rotation of said fine tuning shaft, whereby said fine tuning shaft is operable to be depressed and then rotated to establish a desired fine tuning setting for each channel selected by said channel selector means independently of the other channels.

11. In a television receiver adapted to receive television signals in a plurality of channels each of different predetermined frequency in the very high frequency range, tuning apparatus for providing channel selection and fine tuning of the selected channels, including in combination, rotary channel selector means including a channel selector shaft having a plurality of angularly spaced positions corresponding respectively to channels of the television receiver for selecting such channels, a first supporting structure mounted in a fixed position and having at least a portion thereof extending transversely of said channel selector shaft, said channel selector shaft extending through said portion of first supporting structure and being rotatable with respect thereto, tuning circuit means controlling the fine tuning of the channels selected by said channel selector means and supported by said first supporting structure, said tuning circuit means including adjustable means movable with respect to said first supporting structure and effective to adjust the fine tuning of the channels selected by said channel selector means, control means comprising a plurality of rotary fine tuning control members corresponding respectively to the channels selected by said channel selector means, said fine tuning control members being supported in a circular array about said channel selector shaft for independent adjustment, means coupling individual ones of said fine tuning control members to said adjustable means of said tuning circuit means, rotary adjusting means supported in a position adjacent the circular array of said fine tuning control members and engageable with individual ones thereof for adjusting the same, a second supporting structure spaced along said channel selector shaft from said first supporting structure and connected to said selector shaft, said second supporting structure carrying one of said adjusting means and said control means and being rotatable by said channel selector shaft to establish said adjusting means and any selected tuning control member of said control means corresponding to a channel selected by said channel selector means in a condition for mutual engagement thereof, a fine tuning shaft extending in the same direction as said channel selector shaft and movable axially to move said rotary adjusting means into engagement with said selected fine tuning control member, and spring means urging said fine tuning shaft and said rotary adjusting means to an initial position in which said adjusting means is disengaged from said selected fine tuning control member, said rotary adjusting means including gear means coupled to said fine tuning shaft and rotatable thereby to cause rotation of said selected fine tuning control member upon engagement thereof by said rotary adjusting means, whereby said fine tuning shaft is operable to be moved axially and then rotated to establish a desired fine tuning setting for each channel selected by said channel selector means independently of the other channels.

12. A fine tuning device in accordance with claim 8 wherein said fine tuning shaft is coaxial with said station selector shaft, and said adjusting member is offset radially from said fine tuning shaft in position for engagement between said adjusting member and the one of said fine tuning control means which is in aligned relation therewith, and which tuning device includes spring means urging said adjusting member out of engagement with said one fine tuning control means, with said fine tuning shaft being operable to move said adjusting member into engagement with said one fine tuning control means and to rotate said one fine tuning control means.

13. A fine tuning device for a television tuner of the channel selector type having a rotatable selector shaft and a plurality of separate oscillator coils with one for each channel of the channel selector, which coils provide tuning of television signals of different predetermined frequency in the very high frequency range, said device including in combination, a fine tuning shaft rotatably supported in coaxial relation with the selector shaft, a plurality of independently adjustable fine tuning control means one for each channel of the tuner and arrayed circularly about the selector shaft, said tuning control means each including a core movable with respect to a corresponding one of the oscillator coils for varying the inductance thereof, a rotatable adjusting member positioned adjacent the circular array of said tuning control means and offset radially from said fine tuning shaft, a support member on the selector shaft and rotatable thereby to align said adjusting member and any one of said tuning control means with respect to each other for engagement therebetween as the channel corresponding to said one tuning control means is selected, spring means urging said adjusting member out of engagement with said tuning control means, and driving means coupling said fine tuning shaft with said adjusting member, said fine tuning shaft being movable to cause said adjusting member to engage the tuning control means aligned therewith, and said driving means being operable by rotating said fine tuning shaft to rotate said adjusting member and thereby adjust the fine tuning control means aligned therewith independently of the other fine tuning control means for establishing a desired fine tuning setting for the selected channel without affecting the fine tuning of the other channels.

14. In a tuner for a television receiver, the combination of a rotatable channel selector shaft, a tuning shaft rotatably mounted concentric with said selector shaft and axially slidable with respect thereto, a plurality of independently adjustable rotary tuning control members one for each channel of the tuner and disposed circularly about said selector shaft, a rotatable actuating member positioned adjacent the circular array of said tuning control means, a support member on said selector shaft and rotatable thereby to align said actuating member and one of said tuning control members associated with a selected channel, gear means interconnecting said tuning shaft and said actuating member for transmitting rotary movement therebetween, spring means urging said tuning shaft axially to a fixed initial position with said actuating members spaced from said control members, means for applying torque to said selector shaft for channel selection, and a tuning knob on said tuning shaft operable to be manually depressed to move said tuning shaft axially against the force of said spring means for engaging said actuating member with the tuning control member aligned therewith and being rotatable to adjust the engaged tuning control member to a desired setting.

References Cited in the file of this patent

UNITED STATES PATENTS

| | | |
|---|---|---|
| 1,396,030 | Dubilier | Nov. 8, 1921 |
| 2,154,778 | Schnell | Apr. 18, 1939 |
| 2,533,810 | Jacob | Dec. 12, 1950 |
| 2,545,681 | Zepp | Mar. 20, 1951 |
| 2,807,724 | Felt | Sept. 24, 1957 |
| 2,808,515 | Nesterode | Oct. 1, 1957 |
| 2,839,936 | Dawson | June 24, 1958 |

FOREIGN PATENTS

| | | |
|---|---|---|
| 684,041 | Great Britain | Dec. 10, 1952 |